United States Patent
Schimper

(10) Patent No.: US 7,227,420 B2
(45) Date of Patent: Jun. 5, 2007

(54) TRANSIMPEDANCE AMPLIFIER WITH A HIGH GAIN/BANDWIDTH PRODUCT FOR CONVERSION OF A DAC OUTPUT CURRENT

(75) Inventor: Markus Schimper, Moosinning (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/221,113

(22) Filed: Sep. 6, 2005

(65) Prior Publication Data

US 2006/0055460 A1    Mar. 16, 2006

Related U.S. Application Data

(63) Continuation of application No. PCT/DE2004/000187, filed on Feb. 4, 2004.

(30) Foreign Application Priority Data

Mar. 6, 2003   (DE) ................ 103 09 877

(51) Int. Cl.
*H03F 3/04* (2006.01)
(52) U.S. Cl. .............. 330/310; 330/311; 330/294; 330/260; 330/253; 330/277; 327/560; 327/562; 341/144
(58) Field of Classification Search ........... 250/214 A; 330/311, 310, 294, 260, 253, 291, 277; 341/144; 327/560, 562
See application file for complete search history.

(56) References Cited

U.S. PATENT DOCUMENTS

| | | | |
|---|---|---|---|
| 4,642,551 A | 2/1987 | Miller | 323/314 |
| 5,216,386 A * | 6/1993 | Wyatt | 330/308 |
| 5,446,412 A * | 8/1995 | Kimyacioglu et al. | 330/255 |
| 5,606,288 A | 2/1997 | Prentice | 330/260 |
| 5,834,976 A * | 11/1998 | Tomasini et al. | 330/292 |
| 5,900,779 A | 5/1999 | Giacomini | 330/252 |
| 5,986,502 A | 11/1999 | Nakamura | 330/258 |
| 6,307,660 B1 | 10/2001 | Cordell et al. | 359/189 |
| 6,639,534 B2 * | 10/2003 | Khoini-Poorfard et al. | 341/144 |
| 2002/0167356 A1 | 11/2002 | Renous et al. | 330/253 |

FOREIGN PATENT DOCUMENTS

EP    0 422 496 A2    10/1990

OTHER PUBLICATIONS

Sedra et al. "Microelectronics Circuits" Oxford Press 2004 p. 849-855.*
Tietze, Dr. Ulrich, et al.; Halbleiter-Schaltungstechnik; 11. Aufl., Berlin, Springer, pp. 549-553, 557-558.

* cited by examiner

*Primary Examiner*—Michael B. Shingleton
(74) *Attorney, Agent, or Firm*—Baker Botts L.L.P.

(57)    ABSTRACT

The two output currents (INP, IN) which are produced by a current source digital/analog converter (DAC) are supplied to the two halves of a symmetrical transimpedance amplifier. The input current (INP, IN) is supplied to a first stage, which is formed by a first transistor (N2), and a potential at the output of the first stage is supplied to a second stage, which is formed by a second transistor (N3), and the output voltage (VOUT, VOUTP) is formed by a potential at the output of the second stage. The output of the second stage is coupled to the output of the first stage through a Miller capacitor (Cm). The output of the transimpedance amplifier is coupled to its input by means of a connecting line which contains a feedback resistor (Rf).

11 Claims, 6 Drawing Sheets

PRIOR ART

PRIOR ART

TRANSIMPEDANCE AMPLIFIER WITH A HIGH GAIN/BANDWIDTH PRODUCT FOR CONVERSION OF A DAC OUTPUT CURRENT

CROSS-REFERENCE TO RELATED APPLICATIONS

This application is a continuation of co-pending International Application No. PCT/DE2004/000187 filed Feb. 4, 2004, which designates the United States of America, and claims priority to German application number 103 09 877.1 filed Mar. 6, 2003, the contents of which are hereby incorporated by reference in their entirety.

TECHINCAL FIELD

The present invention relates to a transimpedance amplifier for production of an output voltage from an input current, with the input current being formed in particular by the output current from a digital/analog converter (DAC).

BACKGROUND

In wire-free baseband applications such as UMTS, WLAN as well as digital television and Bluetooth, digital data is converted to analog signals by means of a digital/analog converter (DAC). The analog signals are then up-mixed to the carrier frequency, are post-filtered and are emitted by means of the power amplifier via the antenna to the air interface. In the baseband applications that have been mentioned, broadband modulation methods such as OFDM, DSSS or other broadband modulation methods are used. These modulation methods make better use of the channel bandwidth and thus achieve higher data rates. The linearity, the phase response and attenuation response of the DAC output are subject to stringent requirements resulting from the broadband modulation methods.

FIG. 1 shows a 9-bit current source DAC with 512 individual current sources. Each current source has a switch, which receives a binary signal from a decoder. This signal determines whether a current source is connected to the node Vout,p or to the node Vout,n. If the digital word is altered by an LSB (Least Significant Bit), a current source is switched from Vout,p to Vout,n. Depending on the bit number, the DAC is fully segmented or partially segmented. If the digital word (000000000) is applied to the DAC, 512 current sources are connected to Vout,n, and no current sources are connected to Vout,p. The digital word (111111111) is applied when fully driven, with all of the current sources being connected to Vout,p and none to Vout,n. As can be seen from FIG. 1, the output currents are converted across the resistors to a differential output voltage Voutdiff=Vout,p−Vout,n.

Various circuit arrangements by means of which the two DAC output currents can be converted to a differential output voltage are known from the prior art. The simplest option is to convert the output currents from the DAC directly to two output voltages across the two resistors illustrated in FIG. 1. This solution is highly linear and does not produce any additional harmonics. The phase and attenuation response are influenced only by that pole which is produced across the resistors with the load capacitances. Another known circuit arrangement amplifies the difference voltage across the DAC output resistors using an inverting differential amplifier circuit. It has been found that these known circuit arrangements do not satisfactorily ensure one major aim, specifically the maintenance of the phase and attenuation profile. For this purpose, it is necessary for the converter to have a high gain/bandwidth product, and for no additional poles and null points to be introduced into the current/voltage transfer function during conversion of the DAC output current to the output voltage. The known circuits arrangements do not have these characteristics to an adequate extent.

SUMMARY

Accordingly, one object of the present invention is to specify an apparatus by means of which an input current can be converted to an output voltage with little power consumption, a high gain/bandwidth product and without the introduction of additional poles and null points into the current/voltage transfer function. In particular, the apparatus should be suitable for conversion of the two output currents from a digital/analog current source converter to two output voltages.

The apparatus according to the invention comprises a transimpedance amplifier to which the output current from a digital/analog converter (DAC) can be supplied as the input current, and which produces an output voltage in response to this. The transimpedance amplifier can be designed such that it can be supplied with two input currents, which are the two output currents of a DAC, and such that it produces two output voltages in response to this.

The transimpedance amplifier according to the invention has a first stage for production of a first voltage signal from the input current that is supplied. The transimpedance amplifier according to the invention also has a second stage for production of a second voltage signal from the first voltage signal. A capacitor for frequency compensation is coupled between the output of the first stage and the output of the second stage. A feedback resistor is connected between the input and the output of the transimpedance amplifier.

As will be explained in further detail below, the transimpedance amplifier according to the invention is based on a Miller operational amplifier as known from the prior art. In an operational amplifier such as this, any deterioration in the frequency response caused by parasitic capacitances (Miller effect) is compensated for (frequency compensation) by connection of a Miller capacitor between the output of a first amplification stage, and the output of a second amplification stage. In the case of a fully differential embodiment of the transimpedance amplifier according to the invention, a Miller operational amplifier such as this is modified in such a way that the difference pair of the input transistors is removed, and the DAC output currents are fed in at the same point at which the difference pair has fed in the currents. Feeding the DAC output currents in directly means that the output signal is no longer distorted, since this overcomes the current limiting of the difference pair that occurs as a result of the current source in the Miller operational amplifier. For this reason, the transimpedance amplifier circuit according to the invention also has no inherent limiting of the rate of rise of the output voltage (slew rate), which causes output signal distortion.

One preferred embodiment of the transimpedance amplifier according to the invention is of a fully differential design and has two mutually symmetrical amplifier circuits, to which two input currents can be supplied and which produce a first and a second output voltage. A transimpedance amplifier such as this can be supplied with the two output currents from a current source digital/analog converter.

According to a further embodiment of the transimpedance amplifier according to the invention, the first stage has a first transistor, with the input current being supplied to the input connection of the first transistor, and with the potential of the output connection of the first transistor forming the first voltage signal.

According to a further embodiment of the transimpedance amplifier according to the invention, the second stage has a second transistor, with the first voltage signal being supplied to the control connection of the second transistor, and with the potential at an output connection of the second transistor forming the second voltage signal. The output voltage is formed from the second voltage signal, or is derived from it.

According to a further embodiment, a first current source which, in particular, is formed by a transistor is arranged between a first node, at which the input current is injected into the first stage, and a first reference ground potential.

According to a further embodiment, a second current source which, in particular, is formed by two series-connected transistors, is arranged between a further node, at which the capacitor is connected to the output of the first stage, and a second reference ground potential.

The first current source preferably has a relatively low output impedance, and the second current source has a relatively high output impedance.

According to a further embodiment, an additional resistor can also be connected in series with the Miller capacitor. Furthermore, a further Miller capacitor can also be connected between a node, which is located between the current source transistors, and the output of the transimpedance amplifier.

The invention likewise relates to an apparatus for production of an analog voltage signal from a digital input signal, with the apparatus having a transimpedance amplifier according to the invention and a current source digital/analog converter, whose output current is supplied to the transimpedance amplifier.

This apparatus is preferably designed such that the digital/analog converter produces two output currents and, as already mentioned above, the transimpedance amplifier is designed as a fully differential circuit, to two inputs of which the two output currents from the DAC are supplied and which produces two output voltages in response to this.

BRIEF DESCRIPTION OF THE DRAWINGS

The invention will be explained in detail in the following text with reference to the drawings, in which.

DETAILED DESCRIPTION

Figure 2:
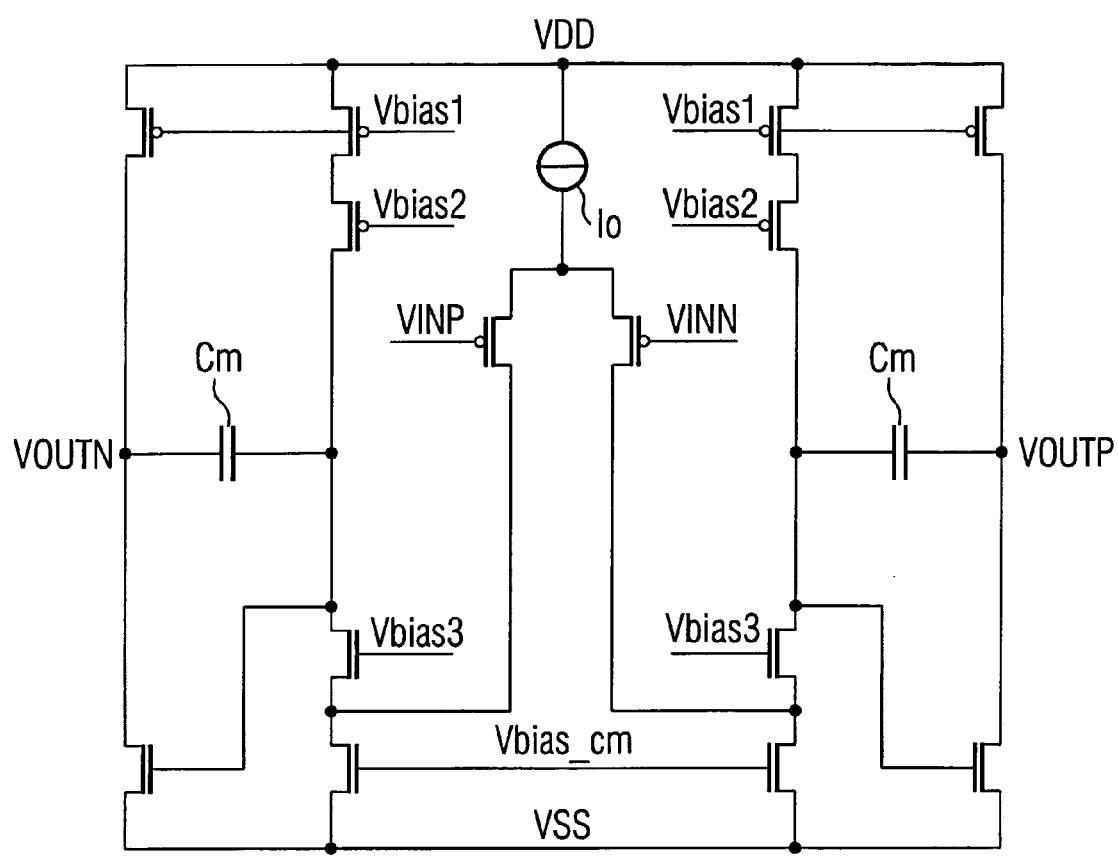
FIG. 2 shows a Miller operational amplifier according to the prior art.

FIG. 2 shows a conventional Miller operational amplifier according to the prior art. The operational amplifier is supplied with two input voltages VINP and VINN, and converts these to two output voltages VOUTN and VOUTP. The two input voltages VINP and VINN are in each case applied to the control electrode (gate) of transistors in a differential amplifier input stage. The transistors are supplied with the current from a current source Io. The rest of the description refers to FIG. 3.

Figure 1:
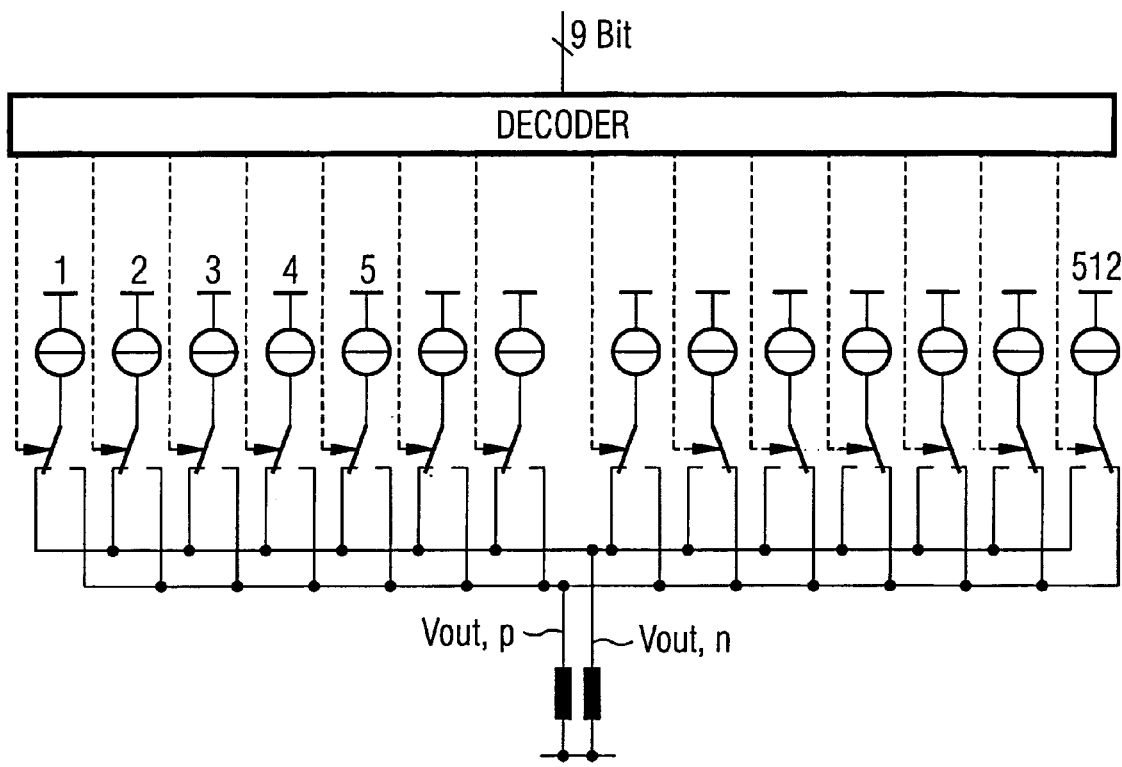
FIG. 1 shows a 9-bit current source DAC according to the prior art.
Figure 3:
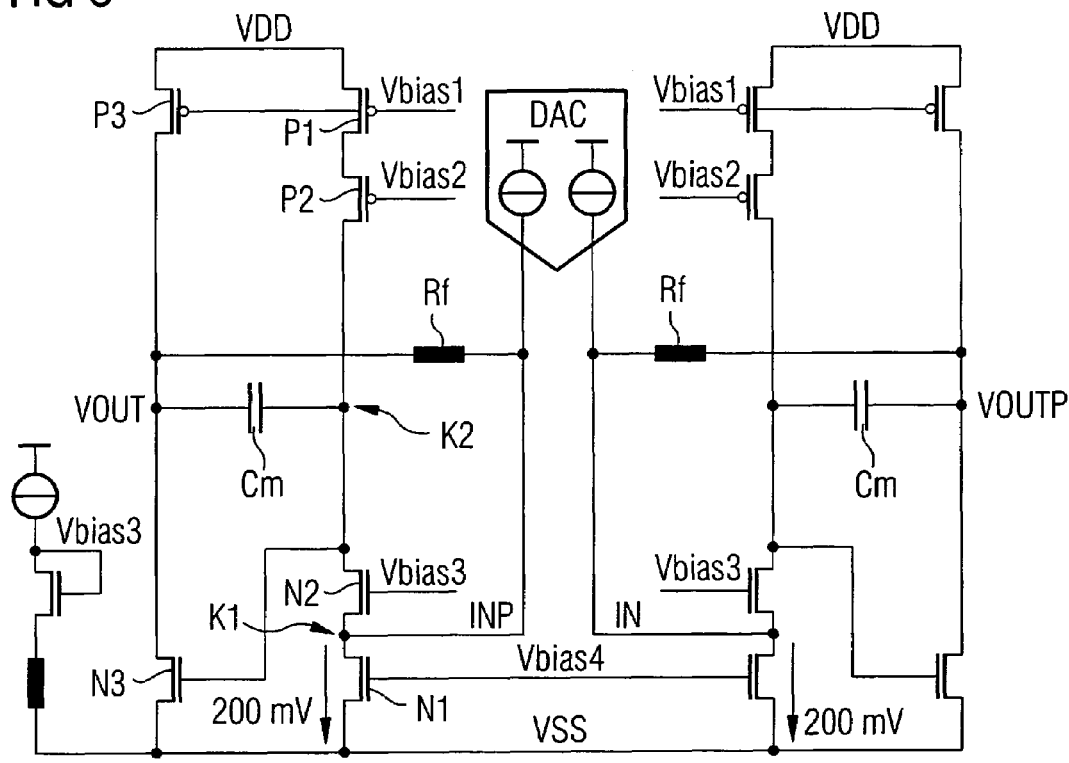
FIG. 3 shows a first embodiment of a transimpedance amplifier according to the invention.

FIG. 3 shows a first embodiment of a transimpedance amplifier according to the invention. One major change from the operational amplifier shown in FIG. 2 is that the difference pair of the input amplifier stage is removed, and input currents are fed in at the same point at which the difference pair has fed in the currents Ip and In. In the illustrated case, the two output currents from a current source DAC are used as the input currents INP and IN, as has been explained in the introduction with reference to FIG. 1. The circuit is designed to be symmetrical, so that the input currents INP and IN are supplied to two identical amplifier circuits. Since the DAC output currents are fed in directly, with the transimpedance amplifier according to the invention, the output signal is no longer distorted, since the current limiting of the difference pair has been eliminated by the current source Io. The transimpedance amplifier according to the invention thus has no inherent limiting of the rate of rise of the output voltage (slew rate), which distorts the output signal.

The input currents are in each case supplied to one input connection of a first transistor N2 which, in its circuitry, acts as a cascode transistor. The potential at the output connection of the first transistor N2 is applied to the control electrode of a second transistor N3, which is connected between the two supply voltages VSS and VDD. The potential which is formed at the electrode connection of the second transistor N3 on the side of the supply voltage VDD forms the output voltage of the transimpedance amplifier.

In the case of the transimpedance amplifier according to the invention as shown in FIG. 3, as well as in the case of the Miller operational amplifier as shown in FIG. 2, a so-called Miller capacitance Cm is connected between the output of the first stage, that is to say at the output of the first transistor N2, and the output of the second stage, in the present case, that is to say the output of the transimpedance amplifier, for frequency compensation reasons.

A further major modification in comparison to the Miller operational amplifier shown in FIG. 2 is that a feedback resistor Rf is connected between the input and the output of the transimpedance amplifier. A connecting line between the output connections and the input connections (which carry the input currents INP and IN) is thus in each case connected to a feedback resistor Rf in each of the two symmetrical branches of the embodiment shown in FIG. 3.

The transimpedance amplifier shown in FIG. 3 has no common-mode control. The output common-mode level is set by the voltage across the cascode transistor N2 and by the steady-state equalization current which flows through the feedback resistor Rf. The voltage across the feedback resistor Rf is constant only when all of the currents which set the operating points of the transistors in the transimpedance amplifier and the DAC output currents are proportional to the bandgap voltage, and are reciprocally proportional to the feedback resistance. The transistors P1 and P2 form a relatively high output impedance current source. The transistor N1 is a reduced output impedance current source. The cascode transistor N2 guarantees that the summation point is exactly 200 mV above the supply potential VSS. The equalization current mentioned above through the feedback resistor Rf is set by the current source P1/P2 and by the current source formed by the transistor N1. If the currents between P1/P2 and N1 are not the same, then ΔI flows through the feedback resistor Rf. This effect allows the common-mode level to be set.

The characteristics of the new Miller frequency compensation for the transimpedance amplifier according to the invention will be explained in more detail with reference to FIG. 4. The illustrated circuit is one of the two halves of the symmetrical transimpedance amplifier circuit without a feedback resistor, as shown in FIG. 3. The Miller capacitor Cm in this illustration is formed by the capacitor C3. A load which is connected to the output of the transimpedance amplifier and is represented by a load capacitor CL and a load resistor RL connected in parallel with it is also taken into account.

Figure 4:
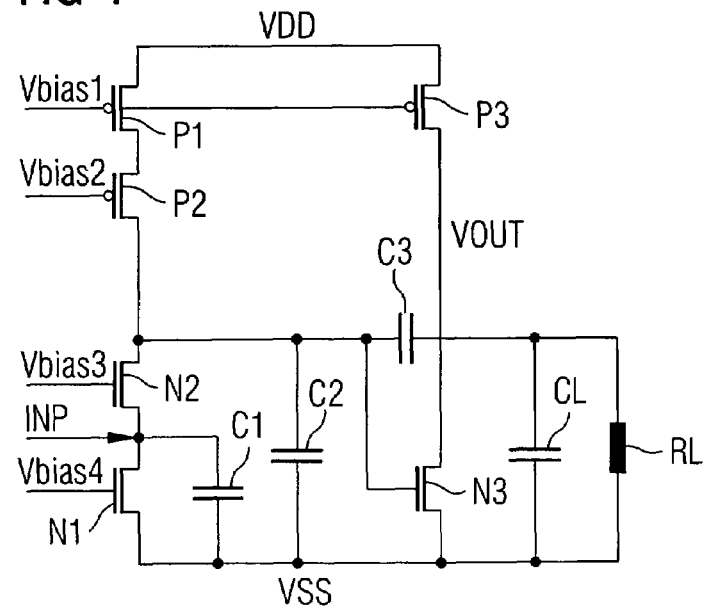
FIG. 4 shows one half of the circuit illustrated in FIG. 3, without a feedback resistor.

If a small-signal analysis is carried out using the Y matrix method on the circuit shown in FIG. 4, then the loop gain A*β, which governs the stability, is defined by an equation with two null points and four poles.

$$A\beta = \frac{y_{21}y_{21}}{y_{11}y_{22}} = \frac{gm_{N2}gm_{N3}(1+s/z_1)(1-s/z_2)}{gds_{N2}g_L(1+s/p_1)(1+s/p_2)(1+s/p_3)(1+s/p_4)}$$

The equations for the two null points:

$$z_1 = \frac{gds_{N2}}{C_3}$$

$$z_2 = \frac{gm_{N3}}{C_3}$$

The equations for the four poles:

$$p_1 = \frac{gds_{N2}}{R_f gm_{N2} C_3}$$

$$p_2 = \frac{g_L gds_{N2}}{gm_{N2} C_3}$$

$$p_3 = \frac{gm_{N3}}{C_L\left(1+\frac{C_2}{C_3}\right)+C_2}$$

$$p_4 = \frac{gm_{N2}}{C_1}$$

$$GBW = \frac{1}{R_f C_3}$$

TABLE 1

| Components | Parameter 1 | Parameter 2 |
| --- | --- | --- |
| NMOS transistor N1 | $gds_{N1}$ = 1.35 mS | |
| NMOS transistor N2 | $gds_{N2}$ = 450 µS | $gm_{N2}$ = 18.3 mS |
| NMOS transistor N3 | $gds_{N3}$ = 2.5 mS | $gm_{N3}$ = 65 mS |
| PMOS transistor P1 | $gds_{P1}$ = 180 µS | |
| PMOS transistor P2 | $gds_{P2}$ = 150 µS | $gm_{P2}$ = 13 mS |
| PMOS transistor P3 | $gds_{P3}$ = 165 µS | |
| Capacitance C1 | $C_1$ = 2 pF | |
| Capacitance C2 | $C_2$ = 400 fF | |
| Capacitance C3 | $C_3$ = 10 pF | |
| Capacitance CL | $C_L$ = 20 pF | |
| Resistor Rf | $R_f$ = 600 Ω | |
| Resistor RL | $R_L$ = 1 kΩ | |

The poles and null points illustrated in Table 2 are obtained from the small-signal parameters listed in Table 1.

TABLE 2

Null points $$z_1 = \frac{450\ \mu S}{10\ pF} = 45\ \text{Mrad/s} \qquad z_2 = \frac{65\ mS}{10\ pF} = 6.5\ \text{Grad/s}$$

Poles $$p_1 = \frac{450\ \mu S}{600\ \Omega \cdot 18.3\ mS \cdot 10\ pF} = 4.1\ \text{Mrad/s} \qquad p_2 = \frac{450\ \mu S \cdot 5.16\ mS}{18.3\ mS \cdot 10\ pF} = 25\ \text{Mrad/s}$$

$$p_3 = \frac{65\ mS}{20\ pF} = 3.35\ \text{Grad/s} \qquad p_4 = \frac{18.3\ mS}{2\ pF} = 9.15\ \text{Grad/s}$$

Gain/bandwidth product $$GBW = \frac{1}{600\ \Omega \cdot 2\ pF} = 166\ \text{Mrad/s}$$

Figure 5:
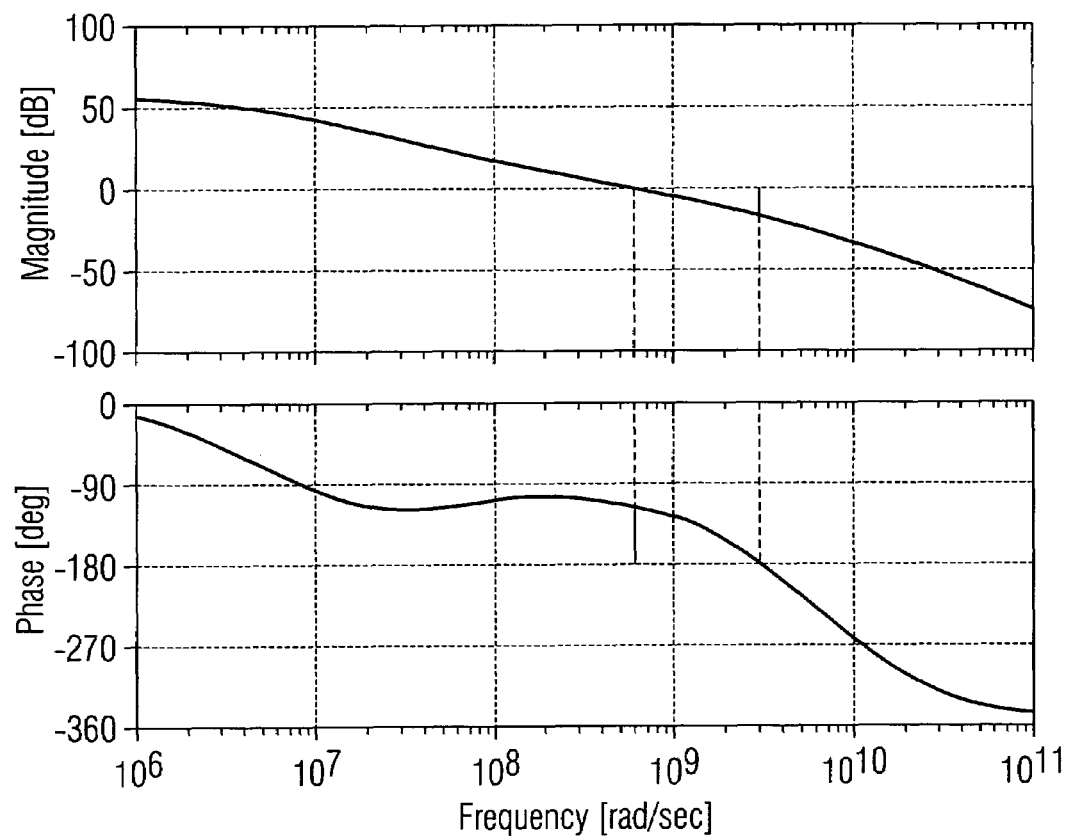
FIG. 5 shows a Bode plot for one embodiment of a transimpedance amplifier according to the invention.

FIG. 5 shows the Bode plot for the embodiment of a transimpedance amplifier according to the invention as described in Tables 1 and 2. As can be seen from the plot, the amplifier has a phase margin of 67°. If the null point $Z_2$ is compensated for by a resistor in series with the Miller capacitor, this results in a phase margin of 70°.

Figure 6:
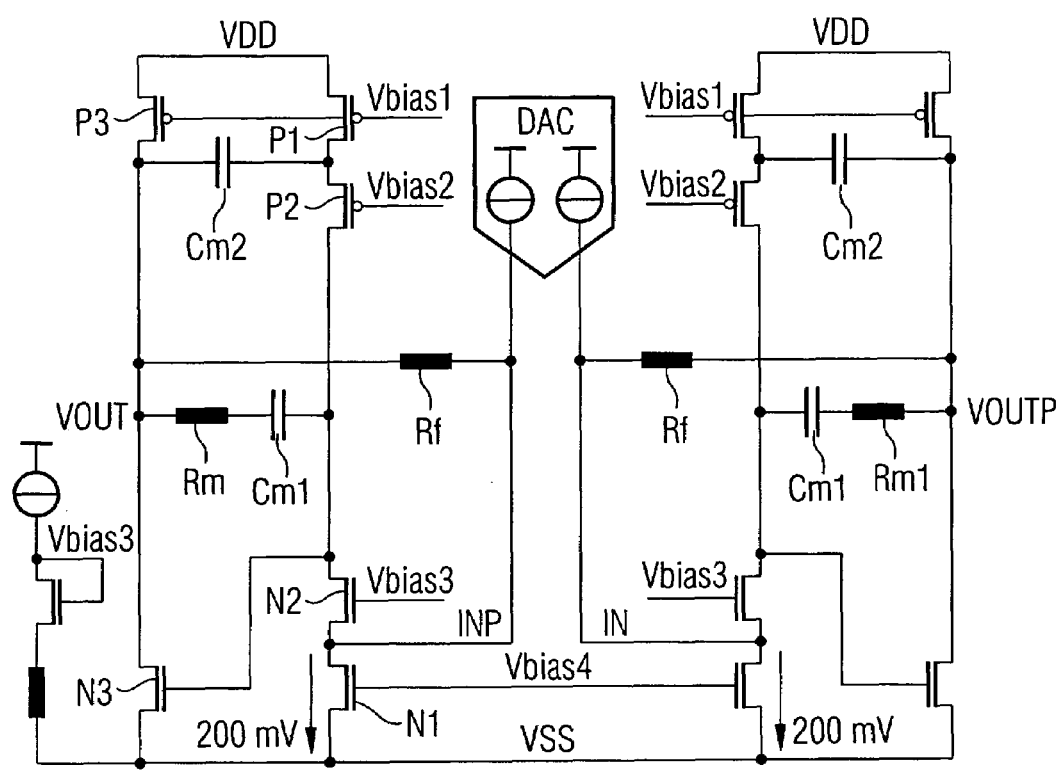
FIG. 6 shows a second embodiment of a transimpedance amplifier according to the invention.

FIG. 6 illustrates a second embodiment of a transimpedance amplifier according to the invention. In this circuit, not only is an additional resistor Rm connected in series with the Miller capacitor Cm1, but an additional Miller capacitor Cm2 is also connected between the output of the transimpedance amplifier and a node which is located between the current source transistors P1 and P2.

The frequency compensation for the transimpedance amplifier according to the invention is similar to the frequency compensation for a two-stage Miller amplifier. The null point $z_2$ and the dominant pole $p_2$ and the non-dominant pole $p_3$ are equivalent to the poles and null points in the Miller amplifier. The transimpedance amplifier also has the pole $p_1$ and the null point $z_1$ in the frequency domain before the gain/bandwidth product GBW. The pole $p_1$ occurs before the null point $z_1$ by the factor $R_f \cdot gm_{N2}$. It is necessary to ensure that the frequency of the null point $z_1$ is four to five times less than the gain/bandwidth product GBW. This is achieved by choosing $gds_{N2}$ to be four to five times less than $1/R_f$. The gain/bandwidth product GBW is governed by the Miller capacitor $C_3$ and by the feedback resistor $R_f$. The circuit also has a second non-dominant pole $p_4$, which should be higher than $p_3$ by the factor 2.

Figure 7:
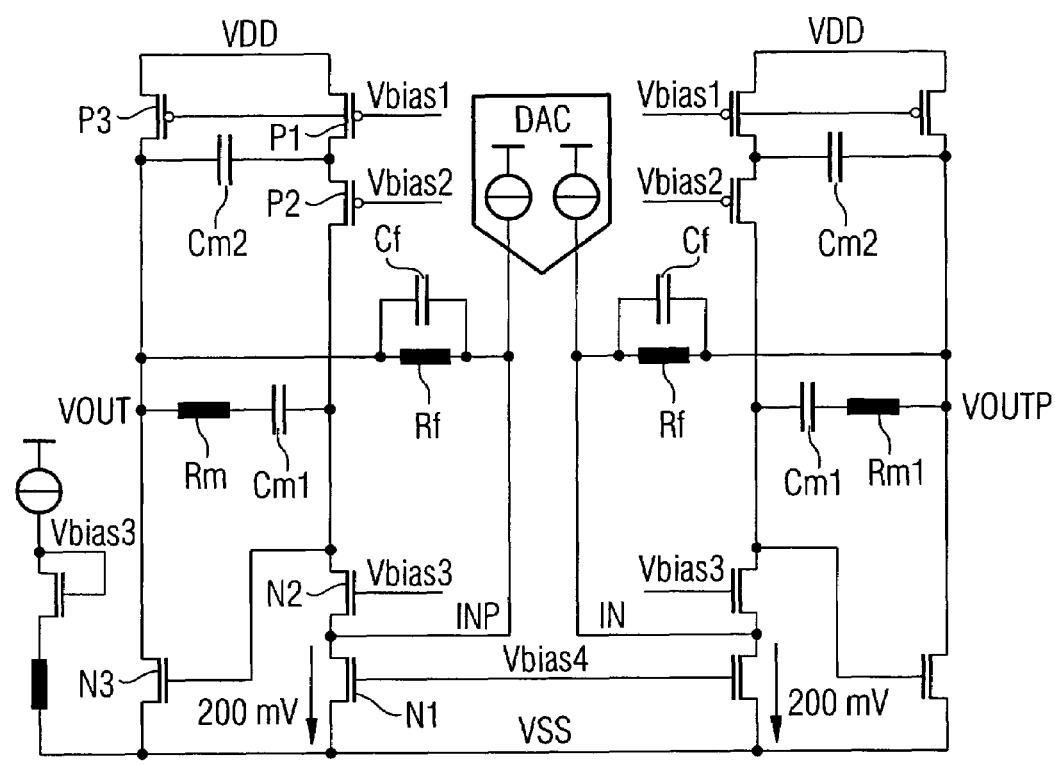
FIG. 7 shows a third embodiment of a transimpedance amplifier according to the invention.

A third embodiment of a transimpedance amplifier according to the invention is illustrated in FIG. 7. In this circuit, in addition to the embodiment shown in FIG. 6, a further capacitor Cf is also connected in parallel with the feedback resistor Rf. In the case of the embodiments shown in FIG. 3 and FIG. 4, it is possible to provide in a manner such as this for a further capacitor Cf to be connected in parallel with each of the feedback resistors Rf.

What is claimed is:

1. A transimpedance amplifier comprising:
a first amplifier circuit for generating a first output voltage and a second amplifier circuit for generating a second output voltage, wherein the first and second amplifier circuits are mutually symmetrical, each amplifier circuit further comprising:
a first stage having an input terminal connected directly to a current source for generating a first voltage signal from an input current, wherein
the input current is supplied at a first node, and
the first stage has a first transistor, the input connection of the first transistor being connected to the first node, and the potential at the output connection of the first transistor forming the first voltage signal,
a second stage generating a second voltage signal from the first voltage signal, wherein the second stage has a second transistor, the first voltage signal being supplied to the control connection of the second transistor, and the potential at a connecting electrode of the second transistor forming the second voltage signal,
a first capacitor for frequency compensation, which is coupled between the output of the first stage and the output of the second stage,
a feedback resistor, which is coupled between the first node and the output of the amplifier circuit, and
a third transistor arranged between the first node and a first reference ground potential, the third transistor forming a current source.

2. A transimpedance amplifier according to claim 1, wherein each of the mutually symmetrical amplifier circuits further comprising:
two series-connected transistors arranged between the output of the first stage and a second reference potential, the two series-connected transistors forming a current source.

3. A transimpedance amplifier according to claim 2, wherein:
the current source formed by the third transistor has a relatively low output impedance, and the current source formed by the two series-connected transistors has a relatively high output impedance.

4. A transimpedance amplifier according to claim 1, wherein each of the mutually symmetrical amnlifier circuits further comprising:
a resistor connected in series with the first capacitor.

5. A transimpedance amplifier according to claim 2, wherein each of the mutually symmetrical amplifier circuits further comprising:
a second capacitor coupled between a second node, which is located between the two series-connected transistors, and the output of the transimpedance amplifier.

6. A transimpedance amplifier according to claim 1, wherein each of the mutually symmetrical amnlifier circuits further comprising:
a second capacitor connected in parallel with the feedback resistor.

7. An apparatus for production of an analog voltage signal from a digital input signal, comprising:
a current source digital/analog converter to which the digital input signal is supplied, the current source digital/analog converter having at least one current source output, and
a transimpedance amplifier comprising:
a first stage having an input terminal directly connected to a first current source for generating a first voltage signal from a first input current,
a second stage generating a second voltage signal from the first voltage signal,
a capacitor for frequency compensation coupled between the output of the first stage and the output of the second stage, and
a feedback resistor coupled between the input and the output of the transimpedance amplifier,
wherein a first current source output of the current source digital/analog converter is directly connected to the input terminal of the first stage of the transimpedance amplifier.

8. An apparatus according to claim 7, wherein:
the current source digital/analog converter produces two current source outputs which are directly connected to the transimpedance amplifier.

9. A method for production of a first and a second output voltage from a first and a second input current, comprising the steps of:
generating a first voltage signal from the supplied first input current provided directly to an input terminal of a first stage of a first amplifier circuit,
generating the first output voltage from the first voltage signal within a second stage of the first amplifier circuit,
providing a capacitor for frequency compensation, which is coupled between the output of the first stage of the first amplifier circuit and the output of the second stage of the first amplifier circuit, and
providing a feedback resistor, which is coupled between the input of the first stage of the first amplifier circuit and the output of the second stage of the first amplifier circuit.
providing a transistor, which is arranged between the input of the first stage of the first amplifier circuit and a first reference around potential,
providing a second amplifier circuit wherein the second amplifier circuit is mutually symmetrical to the first amplifier circuit, the second amplifier circuit generating the second output voltage from the second innut current.

10. A method according to claim 9, comprising the steps of:
generating the first and second input currents within a current source digital/analog converter.

11. A transimpedance amplifier according to claim 1, further comprising:
a current source digital/analog converter having a first output current and a second output current, wherein
the current source connected directly to the input terminal of the first stage of the first amplifier circuit consists of the first output current of the current source digital/analog converter, and
the current source connected directly to the input terminal of the first stage of the second amplifier circuit consists of the second output current of the current source digital/analog converter.

* * * * *